(12) United States Patent
Belonio, Jr. et al.

(10) Patent No.: US 11,309,255 B2
(45) Date of Patent: Apr. 19, 2022

(54) VERY THIN EMBEDDED TRACE SUBSTRATE-SYSTEM IN PACKAGE (SIP)

(71) Applicant: Dialog Semiconductor (UK) Limited, London (GB)

(72) Inventors: Jesus Mennen Belonio, Jr., Neubiberg (DE); Shou Cheng Eric Hu, Taichung (TW); Ian Kent, Chippenham (GB); Ernesto Gutierrez, III, Swindon (GB); Melvin Martin, Fellbach (DE); Rajesh Subraya Aiyandra, Denkendorf (DE)

(73) Assignee: Dialog Semiconductor (UK) Limited, London (GB)

( * ) Notice: Subject to any disclaimer, the term of this patent is extended or adjusted under 35 U.S.C. 154(b) by 106 days.

(21) Appl. No.: 16/830,689

(22) Filed: Mar. 26, 2020

(65) Prior Publication Data

US 2020/0227356 A1 Jul. 16, 2020

Related U.S. Application Data

(62) Division of application No. 15/718,080, filed on Sep. 28, 2017, now Pat. No. 10,636,742.

(51) Int. Cl.
*H01L 23/538* (2006.01)
*H01L 23/498* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 23/49816* (2013.01); *H01L 23/5383* (2013.01); *H01L 23/5386* (2013.01); *H01L 23/3128* (2013.01); *H01L 23/49822* (2013.01); *H01L 23/50* (2013.01); (Continued)

(58) Field of Classification Search
None
See application file for complete search history.

(56) References Cited

U.S. PATENT DOCUMENTS 8,581,405 B2 11/2013 Dertinger et al.
9,565,774 B2 2/2017 Lee
(Continued)

OTHER PUBLICATIONS

U.S. Notice of Allowance, U.S. Appl. No. 15/718,080, First Named Inventor: Jesus Mennen Belonio Jr., dated Dec. 26, 2019, 5 pages.
(Continued)

*Primary Examiner* — Long Pham
(74) *Attorney, Agent, or Firm* — Saile Ackerman LLC; Stephen B. Ackerman; Rosemary L. S. Pike

(57) ABSTRACT

A system in package is provided comprising an embedded trace substrate having redistribution layers therein, at least one passive component mounted on one side of the embedded trace substrate and embedded in a first molding compound, at least one silicon die mounted on an opposite side of the embedded trace substrate and embedded in a second molding compound wherein electrical connections are made between the at least one silicon die and the at least one passive component through the redistribution layers, and solder balls mounted through openings in the second molding layer to the redistribution layers wherein the solder balls provide package output.

14 Claims, 3 Drawing Sheets

(51) Int. Cl.
  *H01L 21/48* (2006.01)
  *H01L 21/56* (2006.01)
  *H01L 23/50* (2006.01)
  *H01L 23/00* (2006.01)
  *H01L 23/31* (2006.01)

(52) U.S. Cl.
  CPC .............. *H01L 24/13* (2013.01); *H01L 24/16* (2013.01); *H01L 24/81* (2013.01); *H01L 2224/0401* (2013.01); *H01L 2224/131* (2013.01); *H01L 2224/13082* (2013.01); *H01L 2224/13147* (2013.01); *H01L 2224/16227* (2013.01); *H01L 2224/16237* (2013.01); *H01L 2224/81815* (2013.01); *H01L 2225/06517* (2013.01); *H01L 2225/06572* (2013.01); *H01L 2924/10253* (2013.01); *H01L 2924/1431* (2013.01); *H01L 2924/1434* (2013.01); *H01L 2924/15311* (2013.01); *H01L 2924/15321* (2013.01); *H01L 2924/18161* (2013.01); *H01L 2924/19105* (2013.01); *H01L 2924/3511* (2013.01); *H01L 2924/37001* (2013.01)

(56) References Cited

U.S. PATENT DOCUMENTS

| | | |
|---|---|---|
| 9,711,502 B2 | 7/2017 | Huang et al. |
| 10,636,742 B2 | 4/2020 | Belonio, Jr. et al. |
| 2013/0241077 A1* | 9/2013 | Fuergut ............... H01L 23/5389 257/774 |
| 2016/0174381 A1 | 6/2016 | Lee et al. |
| 2016/0307847 A1* | 10/2016 | Lee ....................... H01L 23/544 |
| 2017/0338205 A1* | 11/2017 | Sung ................. H01L 23/49816 |
| 2018/0197821 A1* | 7/2018 | Shin .................... H01L 23/3128 |
| 2018/0261569 A1* | 9/2018 | Yang ....................... H01L 25/50 |
| 2019/0057880 A1* | 2/2019 | Song ....................... H01L 24/11 |

OTHER PUBLICATIONS

U.S. Office Action, U.S. Appl. No. 15/718,080, Applicant: Belonio et al., dated Jul. 10, 2019, 8 pages.
U.S. Office Action, U.S. Appl. No. 15/718,080, Applicant: Belonio et al., dated Mar. 27, 2019, 6 pages.
U.S. Office Action, U.S. Appl. No. 15/718,080, Applicant: Belonio et al., dated Oct. 24, 2018, 11 pages.

\* cited by examiner

VERY THIN EMBEDDED TRACE SUBSTRATE-SYSTEM IN PACKAGE (SIP)

TECHNICAL FIELD

This disclosure is related to system in package (SIP) technologies, and more particularly, to SIP technologies integrating a silicon die and passive components through an embedded trace substrate.

BACKGROUND

The internet of things (IOT) involves billions of mobile devices connected to the cloud with infinite possibilities for data. Each of these devices will require, at a minimum, a microcontroller to add intelligence to the device, one or more sensors to allow for data collection, one or more chips to allow for connectivity and data transmission, and a memory component. Semiconductor device manufacturers are constantly confronted with device integration challenges as consumers want electronics to be smaller, more portable and more multi-functional than ever.

Some traditional system in package (SIP) technologies include embedded die substrates (embedded wafer level package eWLP), die side-by-side wire-bonded SIP's, small outline integrated circuit packages (SOIC), quad flat no-lead packages (QFN), and fan-out type SIP's.

U.S. Pat. No. 9,565,774 (Lee) and U.S. Patent Applications 2016/0307847 (Lee et al) and 2016/0174381 (Lee et al) disclose methods of forming and using embedded trace substrates (ETS). U.S. Pat. No. 9,711,502 (Huang et al) and U.S. Pat. No. 8,581,405 (Dertinger et al) show components on both sides of a substrate.

SUMMARY

It is the primary objective of the present disclosure to apply SIP technologies to enable low cost integration of packages on wearable, mobile and IOT devices.

It is a further objective of the present disclosure to integrate a silicon die and passive components with an embedded trace substrate.

Yet another objective is to provide an improved package having lower cost, smaller size, and better performance by integrating a silicon die and passive components with an embedded trace substrate.

A still further objective of the present disclosure is to provide a system in package having a silicon die on one side of an embedded trace substrate (ETS) and passive components on the opposite side of the ETS.

Yet another objective is to provide a method for embedding passive components on one side of a ETS and embedding a silicon die on the opposite side of the ETS.

In accordance with the objectives of the present disclosure, an embedded trace substrate system in package is achieved. A system in package is provided comprising an embedded trace substrate having redistribution layers therein, at least one passive component mounted on one side of the embedded trace substrate and embedded in a first molding compound, at least one silicon die mounted on an opposite side of the embedded trace substrate and embedded in a second molding compound wherein electrical connections are made between the at least one silicon die and the at least one passive component through the redistribution layers, and solder balls mounted through openings in the second molding layer to the redistribution layers wherein the solder balls provide package output.

Also in accordance with the objectives of the present disclosure, a method to fabricate a system in package is achieved. At least one silicon die is provided having a top side and a bottom side wherein a plurality of copper pillars on the top side connect to a circuit layer within the silicon die. An embedded trace substrate is provided having redistribution layers therein. The at least one silicon die is mounted to a first side of the embedded trace substrate wherein the plurality of copper pillars electrically contact the redistribution layers. The at least one silicon die is embedded in a first molding compound. At least one passive component is mounted on a second side of the embedded trace substrate opposite to the first side wherein the at least one passive component electrically contacts the redistribution layers. The at least one passive component is embedded in a second molding compound. The first molding compound is subjected to grinding until the bottom side of the at least one silicon die is exposed. Thereafter, vias are opened through the first molding compound to solder pads electrically contacting the redistribution layers. Solder balls are mounted on the solder pads wherein the solder balls provide package output.

BRIEF DESCRIPTION OF THE DRAWINGS

In the accompanying drawings forming a material part of this description, there is shown.

DETAILED DESCRIPTION

The present disclosure integrates a silicon die and passive components by epoxy material, such as a molding compound, with ETS (Embedded Trace Substrate) as the interconnection between both sides. Multiple redistribution layers are embedded in the pre-impregnated insulator layer of the ETS. With through molded vias processed by laser drilling and solder ball attachment, the signal communication between top side devices (passive devices, sensors, memory) and bottom silicon dies (processor, power management integrated circuit (PMIC), etc.) can be delivered to the bottom solder balls as the output. Better heat dissipation and electrical performance (parasitic capacitance and resistance) can be expected through this embedded trace substrate structure due to a shorter distance between die and the printed circuit board (PCB) connected to the solder balls and shorter signal lines connection between the copper traces and the solder balls compared with a traditional package type.

The total overall SIP package height is defined by ETS substrate thickness, passive components height, and molding process capability limitation. For example, the total package height may be only about 700 to 1500 μm.

Figure 1:
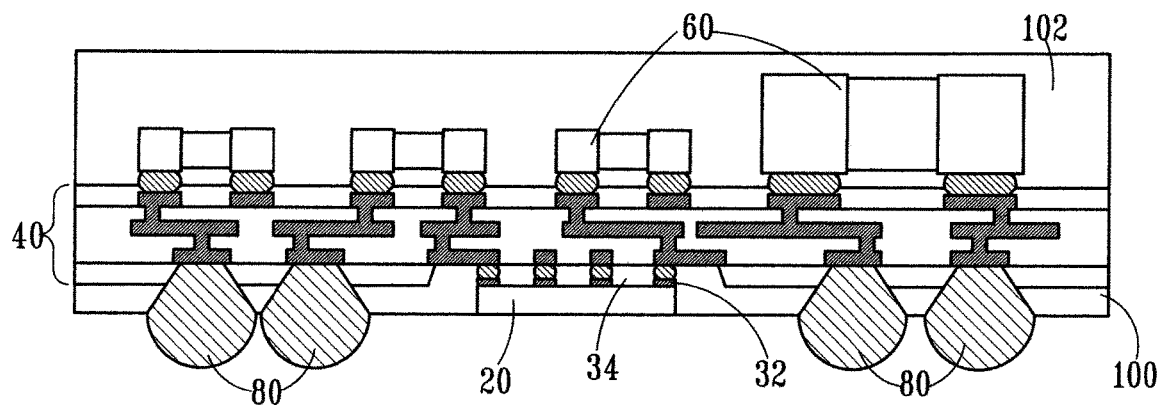
FIG. 1 is a cross-sectional representation of a system in package of the present disclosure.

FIG. 1 illustrates a cross-section of a completed SIP of the present disclosure. Silicon die 20 with copper pillar bump 32 (for example, a processor or PMIC) is attached to one side of embedded trace substrate 40 which is the interconnection between silicon die 20 and passive components 60 in the other side of the ETS. Double side molding (100, 102) onto the thin embedded trace substrate protects the die and components and further controls the SIP package coplanarity and robustness.

Figure 2:
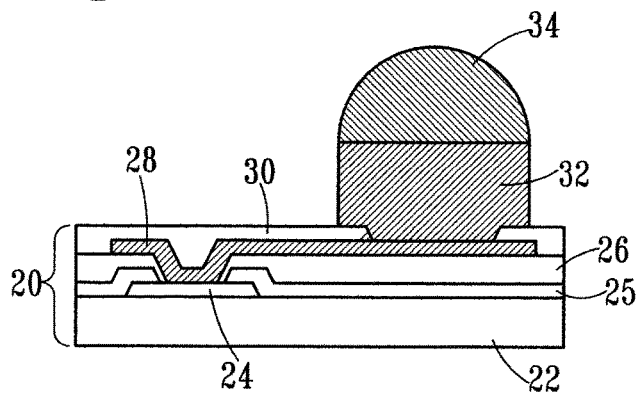
FIGS. 2 through 11 are cross-sectional representations of steps in a process to fabricate the system in package of the present disclosure.

The fabrication process of the ETS SIP of the present disclosure will be further described in detail with reference to FIGS. 2-11. Referring now to FIG. 2, the silicon die or dies are prepared. FIG. 2 illustrates a portion of a silicon die 20. Silicon pads 24 are formed on a silicon substrate 22 through silicon nitride passivation 25.

Redistribution layer 28 is formed through a first passivation layer 26. Second passivation layer 30 is deposited and openings made through the second passivation layer to the redistribution layer 28. Copper pillar bumps 32 are made connecting to the redistribution layer. A solder bump 34 is formed on each copper pillar. While preparing a silicon die is a standard process, process and design rules are followed to cater to a tight pad spacing in a 300 µm bump pitch, for example.

Figure 3:
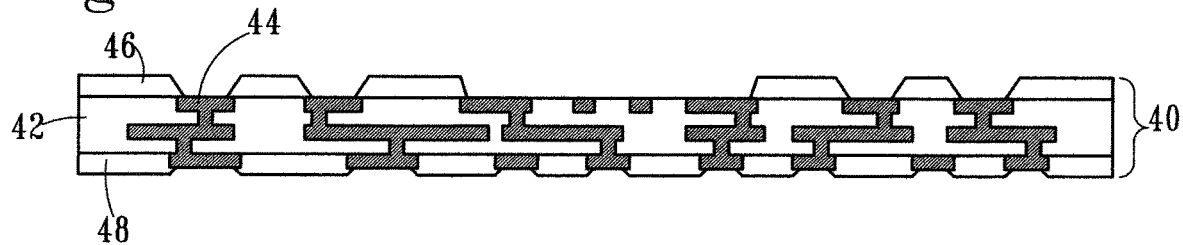

FIG. 3 illustrates an embedded trace substrate (ETS) 40. The thin ETS (coreless substrate) provides the interconnection between the silicon die and passive components which are mounted onto the other side of the ETS substrate. The ETS includes a dielectric layer 42 pre-impregnated with composite fibers in a thermoset polymer matrix such as an epoxy. This dielectric layer 42 serves as an insulator to traces 44 to prevent electrical distortion or shorts within the electrical path of the layers 44. Three copper redistribution layers 44 are illustrated in FIG. 3. There may be more or fewer than three layers, depending on the electrical performance of the package and desired package height.

In FIGS. 2-6, the bottom side 46 of the ETS is shown at the top of the figure and the top side 48 is shown at the bottom of the figure. A solder mask material is coated on a bottom surface 46 and a top surface 48 of the ETS. A standard ETS may be used for the process of the present disclosure so long as it is thin enough (preferably about 85 µm) to accommodate the double side molding process without warpage. The solder mask material 46 and 48 is patterned to provide openings to the redistribution layer 44 on both bottom and top sides of the ETS, as shown in FIG. 3.

Figure 4:
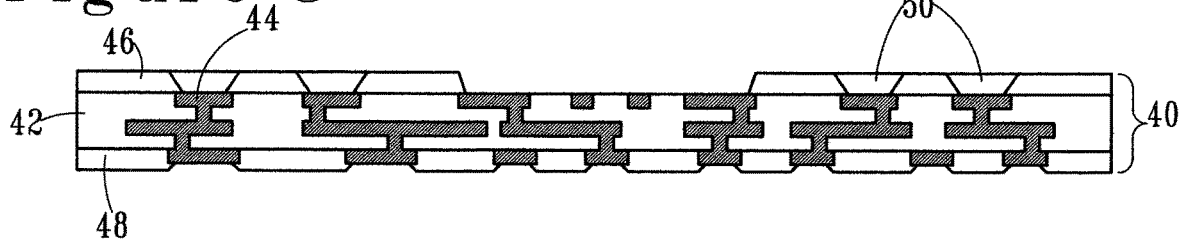

Referring now to FIG. 4, solder paste 50 is printed into openings on the bottom side of the ETS where solder balls will later be placed.

Figure 5:
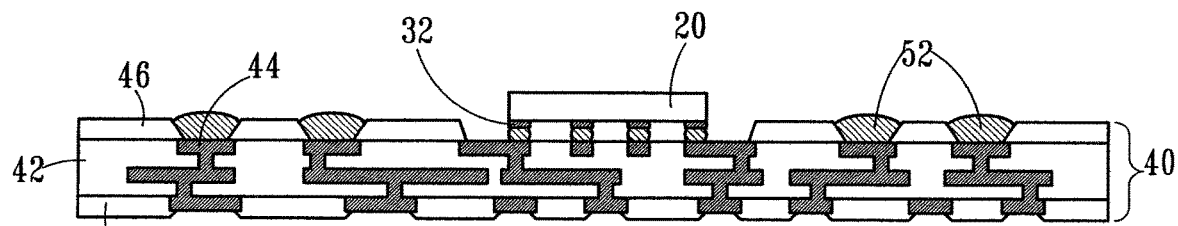

Now, as shown in FIG. 5, silicon die 20 is placed into the opening on the bottom side of the ETS and attached using a standard die attach process. During reflow, the solder paste 50 forms solder pads 52.

Figure 6:
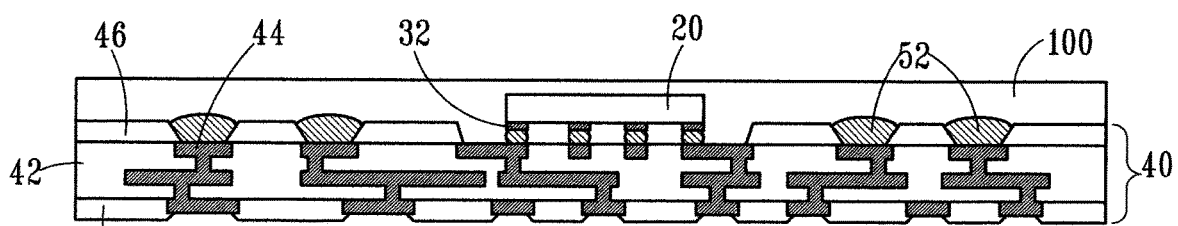

Now, a molding compound 100 is coated on the bottom side of the ETS, encapsulating the die 20, as illustrated in FIG. 6. The die is molded or encapsulated by a compression method using mold granular epoxy resin material with a fine filler to serve as the mold underfill. For example, the molding 100 is cured at about 175° C. for about 120 seconds. The molding thickness is preferably about 150 to 1000 µm. To finish cross-linking, the molding is post-cured at about 175° C. for about 6 hours.

Figure 7:
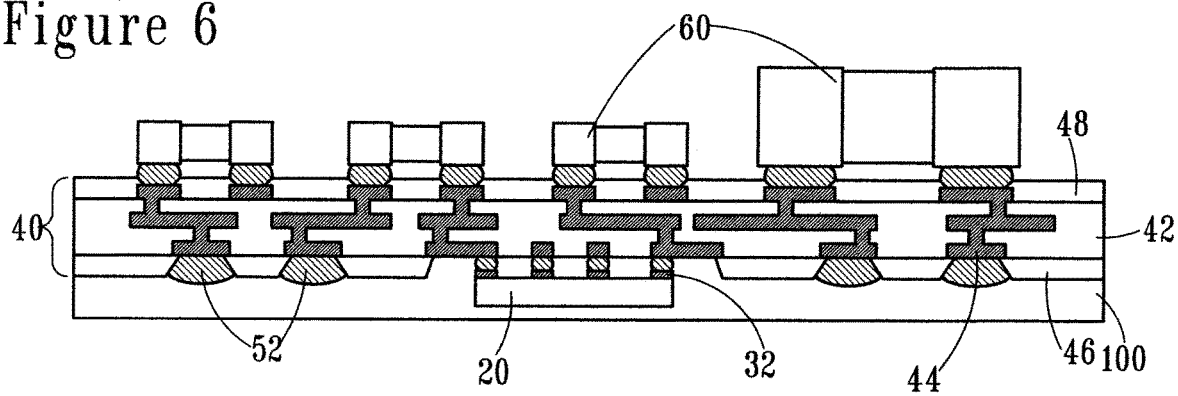

In FIG. 7, the substrate 40 has been flipped over so that the top side 48 is at the top of the figure and the bottom side 46 is at the bottom of the figure. Passive components 60 have been mounted in the openings through the solder mask material layer 48 to the redistribution layers 44. Passive components may be passive devices, sensors, memory, or logic, etc.

Figure 8:
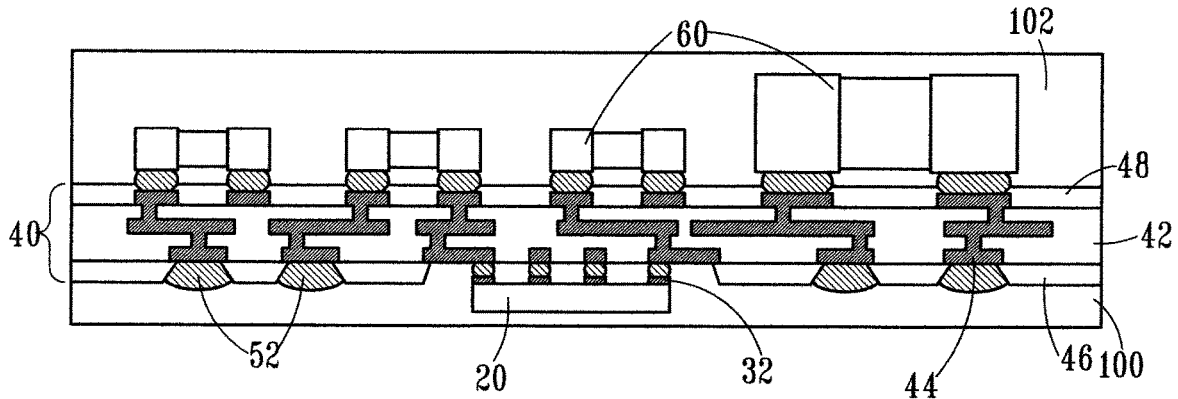

Now, as shown in FIG. 8, a molding compound 102 is coated on the top side of the ETS, encapsulating the passive components 60. The molding material 102 is the same as the molding material 100 and is cured and post-cured in a similar way. The preferred thickness of the molding material 102 is between about 590 and 1000 µm.

Figure 9:
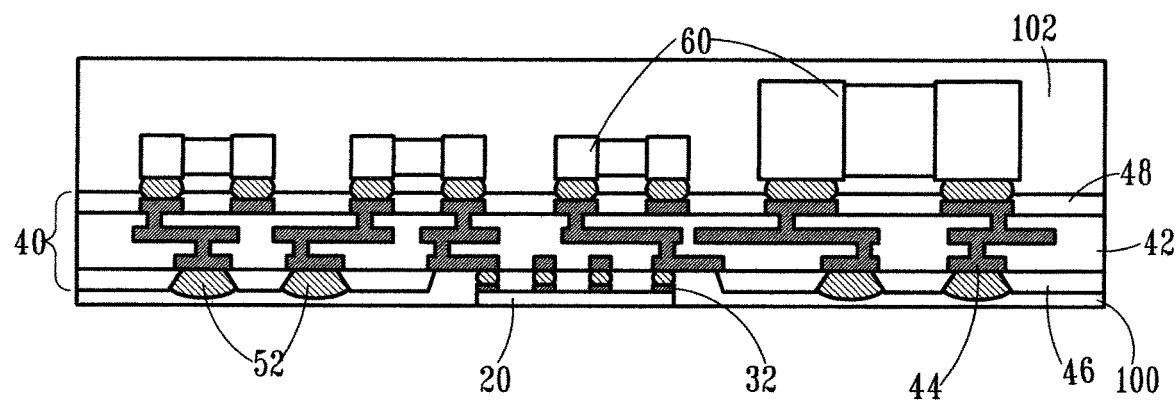

Next, as shown in FIG. 9, the bottom side of the package is ground away until a pre-determined portion of the die 20 has been removed. Grinding is performed to meet the total package height thickness requirement as well as to improve the warpage of the package and process and assembly handling during subsequent process steps.

Figure 10:
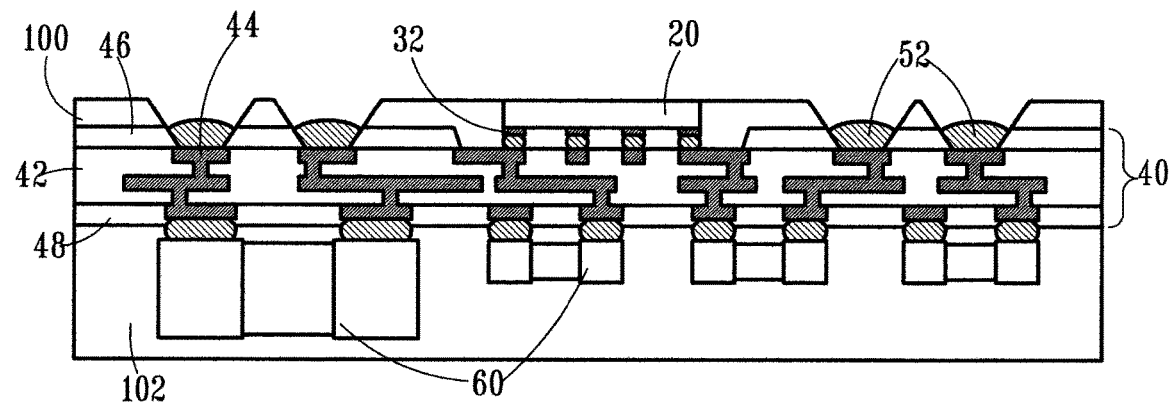

FIGS. 10 and 11 again show the substrate flipped so that the top surface is at the bottom of the figure and the bottom surface is at the top of the figure. Laser drilling is implemented on the die side of the ETS to expose the solder pads 52 of the ETS, as illustrated in FIG. 10.

Figure 11:
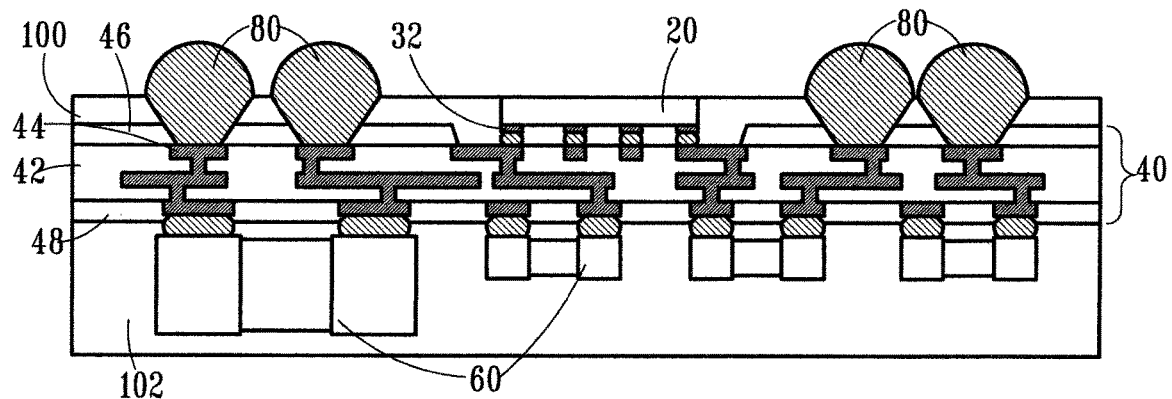

As shown in FIG. 11, solder balls 80 are attached onto the solder pads 52 as the signal and interconnect output. This completes the SIP, as shown in FIG. 1. In post-processing, a printed circuit board (PCB), not shown, will be attached to the solder balls 80. The solder balls are the package output which communicate the signal between the top side devices 60 (passive devices, sensors, memory) and the bottom silicon die 20. Better heat dissipation and electrical performance (parasitic capacitance and resistance) can be expected through this low profile ETS SIP structure due to a shorter distance between the die and the PCB and better passive component integration compared with traditional package type.

Several advantages of the process of the present disclosure include:

1. Integrating different passive devices and different packages which function as a system.
2. Reducing package size.
3. Better heat dissipation because the silicon surface is exposed at the bottom of the package.
4. Better electrical performance. Resistance is improved because the ETS has thicker copper traces. Each of the preferably three copper layers is about 8 µm thick as opposed to the single copper trace in a traditional SIP having a thickness of about 5 µm. Capacitance is lower in the ETS SIP due to a thicker gap between the copper traces in the ETS than in a traditional package. Larger via holes in the ETS SIP (about 45 µm) helps to reduce resistance compared to the traditional fan out SIP (about 9 µm).
5. Less process complexity versus the like system in package using a Fan-out package. Cycle time for the process of the present disclosure is less than half the cycle time of the traditional Fan-out package.
6. Lower packaging, equipment, and infrastructure cost compared to other SIP Fan-out package solutions, due fewer process steps and less cycle time.
7. Short manufacturing cycle time comparing with other SIP Fan out Solutions.
8. Using "Chip Last" Methodology improves yield and revenue. That is, using the ETS assures the metal interconnect layers are formed prior to mounting the chip, so the chip will not be damaged by metal layer forming processes.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method to fabricate a system in package comprising:
   providing at least one silicon die having a top side and a bottom side wherein a plurality of copper pillars on said top side connect to a circuit layer within said silicon die;

providing a substrate comprising:
  an inner pre-impregnated material layer;
  at least three metal redistribution layers within said impregnated material; and
  a solder mask material on top and bottom of said pre-impregnated material;
mounting said at least one silicon die in an opening to said metal redistribution layers on a first side of said substrate wherein said plurality of copper pillars electrically contact said metal redistribution layers;
embedding said at least one silicon die in a first molding compound;
mounting at least one passive component in an opening to said metal redistribution layers on a second side of said substrate opposite to said first side wherein said at least one passive component electrically contacts said metal redistribution layers;
embedding said at least one passive component in a second molding compound wherein electrical connections are made between said at least one silicon die and said at least one passive component through said metal redistribution layers;
grinding said first molding compound until said bottom side of said at least one silicon die is exposed;
thereafter opening vias through said first molding compound to solder pads electrically contacting said metal redistribution layers; and
mounting solder balls on said solder pads wherein said solder balls provide package output.

2. The method according to claim 1 wherein said metal redistribution layers comprise copper.

3. The method according to claim 1 wherein there are three said metal redistribution layers.

4. The method according to claim 1 wherein said system in package has a total thickness of between about 700 and 1500 μm.

5. The method according to claim 1 wherein said first and second molding compound comprises an epoxy resin.

6. The method according to claim 1 wherein said substrate is an embedded trace substrate.

7. The method according to claim 1 wherein said substrate is a coreless substrate.

8. A method to fabricate a system in package comprising:
providing at least one silicon die having a top side and a bottom side wherein a plurality of copper pillars on said top side connect to a circuit layer within said silicon die;
providing a substrate having metal redistribution layers therein;
mounting said at least one silicon die in an opening to said metal redistribution layers on a first side of said substrate wherein said plurality of copper pillars electrically contact said metal redistribution layers;
embedding said at least one silicon die in a first molding compound;
mounting at least one passive component in an opening to said metal redistribution layers on a second side of said substrate opposite to said first side wherein said at least one passive component electrically contacts said metal redistribution layers;
embedding said at least one passive component in a second molding compound;
grinding said first molding compound until said bottom side of said at least one silicon die is exposed;
thereafter opening vias through said first molding compound to solder pads electrically contacting said metal redistribution layers; and
mounting solder balls on said solder pads wherein said solder balls provide package output.

9. The method according to claim 8 wherein said metal redistribution layers comprise copper.

10. The method according to claim 8 wherein there are three said metal redistribution layers.

11. The method according to claim 8 wherein said system in package has a total thickness of between about 700 and 1500 μm.

12. The method according to claim 8 wherein said first and second molding compound comprises an epoxy resin.

13. The method according to claim 8 wherein said substrate is an embedded trace substrate.

14. The method according to claim 8 wherein said substrate is a coreless substrate.

\* \* \* \* \*